US009279543B2

(12) United States Patent
Lay et al.

(10) Patent No.: US 9,279,543 B2
(45) Date of Patent: Mar. 8, 2016

(54) LED PACKAGE MOUNT

(75) Inventors: James Michael Lay, Cary, NC (US); Long Larry Le, Morrisville, NC (US); Paul Kenneth Pickard, Morrisville, NC (US); Antony Paul van de Ven, Hong Kong (CN); James Christopher Wellborn, Apex, NC (US)

(73) Assignee: Cree, Inc., Durham, NC (US)

( * ) Notice: Subject to any disclaimer, the term of this patent is extended or adjusted under 35 U.S.C. 154(b) by 568 days.

(21) Appl. No.: 12/901,034

(22) Filed: Oct. 8, 2010

(65) Prior Publication Data

US 2012/0087137 A1 Apr. 12, 2012

(51) Int. Cl.

| | |
|---|---|
| ***F21V 29/00*** | (2015.01) |
| ***H05K 13/00*** | (2006.01) |
| ***F21K 99/00*** | (2010.01) |
| ***F21V 19/00*** | (2006.01) |
| ***F21V 29/74*** | (2015.01) |
| ***F21V 29/83*** | (2015.01) |
| *F21Y 101/02* | (2006.01) |

(Continued)

(52) U.S. Cl.
CPC ................. *F21K 9/00* (2013.01); *F21V 19/003* (2013.01); *F21V 19/0045* (2013.01); *F21V 29/004* (2013.01); *F21V 29/74* (2015.01); *F21V 29/83* (2015.01); *F21V 29/86* (2015.01); *F21V 29/89* (2015.01); *F21Y 2101/02* (2013.01); *Y10T 29/49002* (2015.01)

(58) Field of Classification Search
CPC ..... F21V 19/00; F21V 17/104; F21V 19/001; F21V 19/0025; F21V 17/16; F21V 17/10; F21V 19/0015; F21V 19/003; F21V 19/0045; F21V 29/004; F21V 29/74; F21V 29/83; F21V 29/86; F21V 29/89; F21K 9/30; F21K 9/00; F21Y 2101/02; Y10T 29/49002
USPC .................................. 361/720; 362/373, 294
See application file for complete search history.

(56) References Cited

U.S. PATENT DOCUMENTS 3,581,162 A 5/1971 Wheatley
4,994,734 A * 2/1991 Germer et al. ................ 324/142

(Continued)

FOREIGN PATENT DOCUMENTS

CN 101487583 A 7/2009
EP 1058221 A2 12/2000

(Continued)

OTHER PUBLICATIONS

Patent Cooperation Treaty (PCT), International Search Report, PCT/US2011/026796, Jul. 26, 2011.

(Continued)

*Primary Examiner* — Stephen F Husar
(74) *Attorney, Agent, or Firm* — Dennis J. Williamson; Moore & Van Allen PLLC

(57) ABSTRACT

A light emitting diode package mounting apparatus comprises a heatsink defining a surface comprising one of a male or female connector. An LED package has a base where a portion of the base defines the other of the female or male connector. The connectors engage one another such that a force is exerted on the base that presses the LED package against the surface. To assemble the LED package in the heat sink, the LED package is located on the surface. The LED package and heatsink are moved relative to one another such that the male connector is inserted into the female connector.

21 Claims, 10 Drawing Sheets

(51) Int. Cl.

| | |
|---|---|
| *F21V 29/85* | (2015.01) |
| *F21V 29/89* | (2015.01) |

(56) References Cited

U.S. PATENT DOCUMENTS

| | | | | |
|---|---|---|---|---|
| 5,463,280 | A | 10/1995 | Johnson | |
| 5,561,346 | A | 10/1996 | Byrne | |
| 5,585,783 | A | 12/1996 | Hall | |
| 5,655,830 | A | 8/1997 | Ruskouski | |
| 5,688,042 | A | 11/1997 | Madadi et al. | |
| 5,806,965 | A | 9/1998 | Deese | |
| 5,947,588 | A | 9/1999 | Huang | |
| 5,949,347 | A | 9/1999 | Wu | |
| 6,220,722 | B1 | 4/2001 | Begemann | |
| 6,227,679 | B1 | 5/2001 | Zhang et al. | |
| 6,234,648 | B1 | 5/2001 | Borner et al. | |
| 6,250,774 | B1 | 6/2001 | Begemann et al. | |
| 6,276,822 | B1 | 8/2001 | Bedrosian et al. | |
| 6,465,961 | B1 | 10/2002 | Cao | |
| 6,523,978 | B1 | 2/2003 | Huang | |
| 6,550,953 | B1 | 4/2003 | Ichikawa et al. | |
| 6,634,770 | B2 | 10/2003 | Cao | |
| 6,659,632 | B2 | 12/2003 | Chen | |
| 6,709,132 | B2 | 3/2004 | Ishibashi | |
| 6,791,840 | B2 * | 9/2004 | Chun | 361/715 |
| 6,803,607 | B1 | 10/2004 | Chan et al. | |
| 6,848,819 | B1 | 2/2005 | Arndt et al. | |
| 6,864,513 | B2 | 3/2005 | Lin et al. | |
| 6,948,829 | B2 | 9/2005 | Verdes et al. | |
| 6,982,518 | B2 | 1/2006 | Chou et al. | |
| 7,048,412 | B2 | 5/2006 | Martin et al. | |
| 7,080,924 | B2 | 7/2006 | Tseng et al. | |
| 7,086,756 | B2 | 8/2006 | Maxik | |
| 7,086,767 | B2 | 8/2006 | Sidwell et al. | |
| 7,144,135 | B2 | 12/2006 | Martin et al. | |
| 7,165,866 | B2 | 1/2007 | Li | |
| 7,172,314 | B2 | 2/2007 | Currie et al. | |
| 7,322,718 | B2 * | 1/2008 | Setomoto et al. | 362/276 |
| 7,354,174 | B1 | 4/2008 | Yan | |
| 7,396,142 | B2 | 7/2008 | Laizure, Jr. et al. | |
| 7,549,786 | B2 * | 6/2009 | Higley et al. | 362/646 |
| 7,600,882 | B1 | 10/2009 | Morejon et al. | |
| 7,726,836 | B2 | 6/2010 | Chen | |
| 7,824,065 | B2 | 11/2010 | Maxik | |
| 7,918,591 | B2 * | 4/2011 | Lynch | 362/365 |
| 7,926,991 | B2 * | 4/2011 | Hamada | 362/490 |
| 7,965,023 | B1 | 6/2011 | Liang | |
| 8,021,025 | B2 | 9/2011 | Lee | |
| 8,152,336 | B2 * | 4/2012 | Alexander et al. | 362/249.11 |
| 8,241,044 | B2 * | 8/2012 | Mostoller et al. | 439/56 |
| 8,253,316 | B2 | 8/2012 | Sun et al. | |
| 8,272,762 | B2 | 9/2012 | Maxik et al. | |
| 8,274,241 | B2 | 9/2012 | Guest et al. | |
| 8,277,082 | B2 | 10/2012 | Dassanayake et al. | |
| 8,282,249 | B2 | 10/2012 | Liang et al. | |
| 8,282,250 | B1 | 10/2012 | Dassanayake et al. | |
| 8,292,468 | B2 | 10/2012 | Narendran et al. | |
| 8,322,896 | B2 | 12/2012 | Falicoff et al. | |
| 8,342,716 | B2 * | 1/2013 | Lin | 362/294 |
| 8,348,478 | B2 * | 1/2013 | Pelton et al. | 362/373 |
| 8,371,722 | B2 | 2/2013 | Carroll | |
| 8,400,051 | B2 | 3/2013 | Hakata et al. | |
| 8,414,178 | B2 * | 4/2013 | Alexander et al. | 362/655 |
| 8,415,865 | B2 | 4/2013 | Liang et al. | |
| 8,421,320 | B2 | 4/2013 | Chuang | |
| 8,421,321 | B2 | 4/2013 | Chuang | |
| 8,421,322 | B2 | 4/2013 | Carroll et al. | |
| 8,427,037 | B2 | 4/2013 | Liang et al. | |
| 8,444,308 | B2 * | 5/2013 | Matsunaga et al. | 362/548 |
| 8,449,154 | B2 | 5/2013 | Uemoto et al. | |
| 8,502,468 | B2 | 8/2013 | Li et al. | |
| 8,556,465 | B2 | 10/2013 | Lee et al. | |
| 8,641,237 | B2 | 2/2014 | Chuang | |
| 8,653,723 | B2 | 2/2014 | Cao et al. | |
| 8,696,168 | B2 | 4/2014 | Li et al. | |
| 8,740,415 | B2 | 6/2014 | Wheelock | |
| 8,750,671 | B1 | 6/2014 | Kelly et al. | |
| 8,752,984 | B2 | 6/2014 | Lenk et al. | |
| 8,760,042 | B2 | 6/2014 | Sakai et al. | |
| 2004/0201990 | A1 | 10/2004 | Meyer | |
| 2007/0001870 | A1 * | 1/2007 | Rohlfing et al. | 340/907 |
| 2007/0171667 | A1 * | 7/2007 | Watanabe et al. | 362/545 |
| 2007/0195528 | A1 * | 8/2007 | Wu | 362/249 |
| 2008/0106892 | A1 * | 5/2008 | Griffiths et al. | 362/223 |
| 2009/0023323 | A1 * | 1/2009 | Lin et al. | 439/345 |
| 2009/0046462 | A1 * | 2/2009 | Park et al. | 362/249 |
| 2009/0180289 | A1 * | 7/2009 | Hsu | 362/373 |
| 2009/0184618 | A1 | 7/2009 | Hakata et al. | |
| 2009/0244909 | A1 * | 10/2009 | Chen | 362/368 |
| 2010/0265700 | A1 * | 10/2010 | Galluccio et al. | 362/217.13 |
| 2011/0136374 | A1 * | 6/2011 | Mostoller et al. | 439/487 |
| 2011/0261572 | A1 * | 10/2011 | Watanabe et al. | 362/373 |
| 2012/0040585 | A1 | 2/2012 | Huang | |

FOREIGN PATENT DOCUMENTS

| | | | |
|---|---|---|---|
| EP | 0890059 | B1 | 6/2004 |
| EP | 2218962 | A2 | 8/2010 |
| GB | 2345954 | A | 7/2000 |
| JP | H09265807 | A | 10/1997 |
| JP | 2000173304 | A | 6/2000 |
| JP | 2001118403 | A | 4/2001 |
| JP | 2002104049 | A | 4/2002 |
| JP | 2005038798 | A | 2/2005 |
| JP | 2008524816 | A | 7/2006 |
| JP | 2007273205 | A | 10/2007 |
| WO | 0124583 | A1 | 4/2001 |
| WO | 0160119 | A2 | 8/2001 |
| WO | 2006049086 | A1 | 5/2006 |
| WO | 2009128005 | A1 | 10/2009 |
| WO | 2009150590 | A1 | 12/2009 |
| WO | 2012011279 | A1 | 1/2012 |
| WO | 2012031533 | A1 | 3/2012 |

OTHER PUBLICATIONS

Patent Cooperation Treaty (PCT), Written Opinion of the International Searching Authority, PCT/US2011/026796, Jul. 26, 2011.

Cree, Inc., Chinese Application No. 201180048604.8, First Office Action, Nov. 3, 2014.

Cree, Inc., Taiwanese Application No. 100106964, Office Action, Dec. 12, 2014.

Cree, Inc., Japanese Application No. 2013-532791, Appeal No. 2014-026685, Re-examination Report, Apr. 21, 2015.

Cree, Inc., Japanese Application No. 2013-532791, Office Action, Mar. 11, 2014.

Taiwan Intellectual Property Office; Office Action; May 9, 2014; issued in Taiwanese Patent Application No. 100106964.

* cited by examiner

LED PACKAGE MOUNT

The invention relates to light emitting diodes (LED's) and more particularly to an improved LED package mounting apparatus and method.

BACKGROUND

LED lighting structures typically comprise an LED circuit board comprising one or more LED'S for projecting light through a lens. The LED board is attached to a heat dissipating substrate such as a metal core printed circuit board (MCPCB). The LED board, lens and substrate comprise an LED package that is secured to a heatsink where the heatsink may comprise fins or other structure for dissipating heat to the ambient environment. The dissipation of heat from the LED package is needed to maintain good performance of the LED over time.

SUMMARY

It has been found that in some applications the use of screws to attach the LED package to the heatsink may adversely affect heat transfer from the LED to the heat sink due to waffling of the LED package, uneven torque application of the screws on the LED board, screw loosening, and inefficient heat transfer properties between the LED package, screws and heatsink. Moreover, the use of separate screws and external hardware as the attachment mechanism increases manufacturing time and cost of LED products especially in high volume production. To eliminate the problems associated with the use of screws, a heatsink with prefabricated connector is provided. The LED package is placed into the heatsink such that a male or female connector on the LED package is engaged by a mating female or male connector on the heat sink. The connectors provide a constant clamping force over time to maintain contact between the heatsink and the LED package to thereby ensure good heat transfer between the LED package and the heatsink.

A light emitting diode (LED) package mounting apparatus comprises a heatsink comprising a surface and one of a female connector or a male connector. An LED package comprises the other one of the female connector or male connector. The male connector engages the female connector such that a force is exerted on the LED package that clamps the LED package against the surface.

The female connector may comprise an arm, where the arm may be disposed over the surface to define a space between the arm and the surface and the LED package may comprise a base that comprises the male connector that is disposed in the space. The arm may be configured such that the arm exerts the force on the base that clamps the LED package against the surface. A plurality of arms may be provided where the plurality of arms are equally spaced about the surface. The plurality of arms may be arranged in opposed pairs. The male connector may comprise a plurality of projections extending from the base where the plurality of projections are spaced from one another by a plurality of recesses, the plurality of recesses being wider than the plurality of arms. The arm may extend in a cantilevered fashion. The arm may comprise a camming surface for pressing the base against the surface and a projection for mechanically engaging the base. A mounting shoulder may comprise a projection that extends from the base. The base may comprise a plurality of mounting shoulders spaced from one another by a plurality of recesses, each off the plurality of recesses being wider than each of the plurality of arms. A tab may engage the LED package to fix the position of the LED package relative to the surface. The surface may comprise a first engagement member that engages a second mating engagement member on the base to locate the base relative to the surface. The base may be rotatable relative to the surface about the engagement members.

A method of assembling a LED package on a heat sink comprises providing a heatsink comprising a surface and one of a male connector or a female connector; providing an LED package having the other one of the male connector or the female connector; locating the LED package on the surface; moving the LED package and heatsink relative to one another such that the male connector is inserted into the female connector.

In the method the female connector may comprise an arm spaced from the surface to define a space between the arm and the surface. The step of moving the LED package relative to the surface may comprise rotating the LED package such that a portion of the LED package is disposed under the arm. The step of moving the LED package relative to the surface may further comprise engaging a stop to limit movement of the LED package.

DETAILED DESCRIPTION OF EMBODIMENTS OF THE INVENTION

Figure 1:
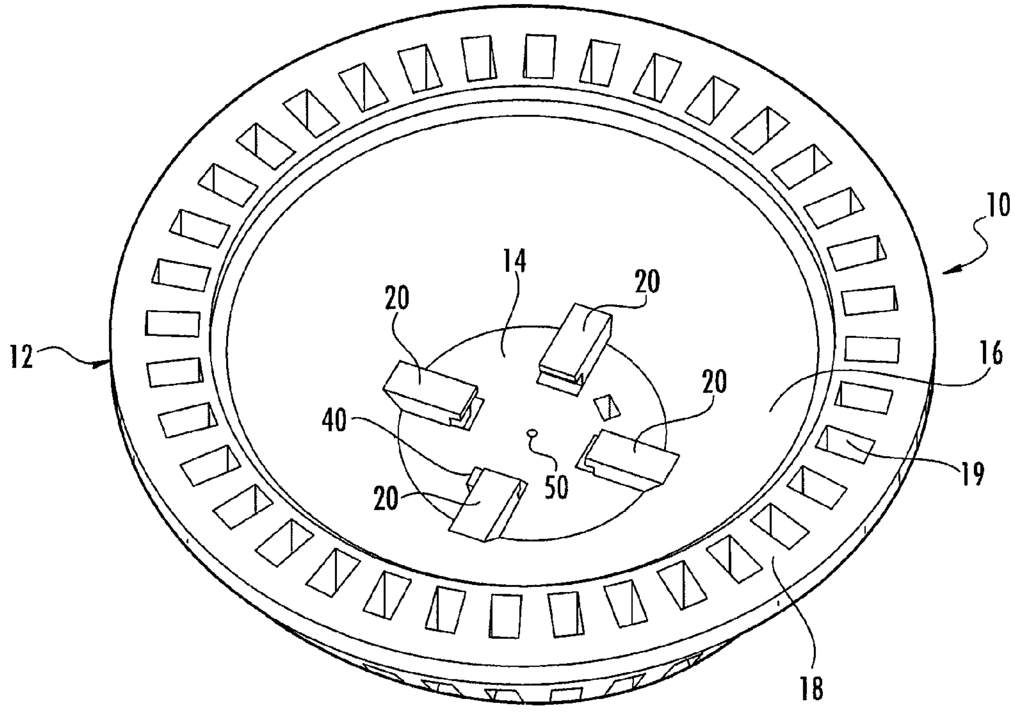
FIG. 1 is a perspective view of an embodiment of the heatsink of the invention.
Figure 2:
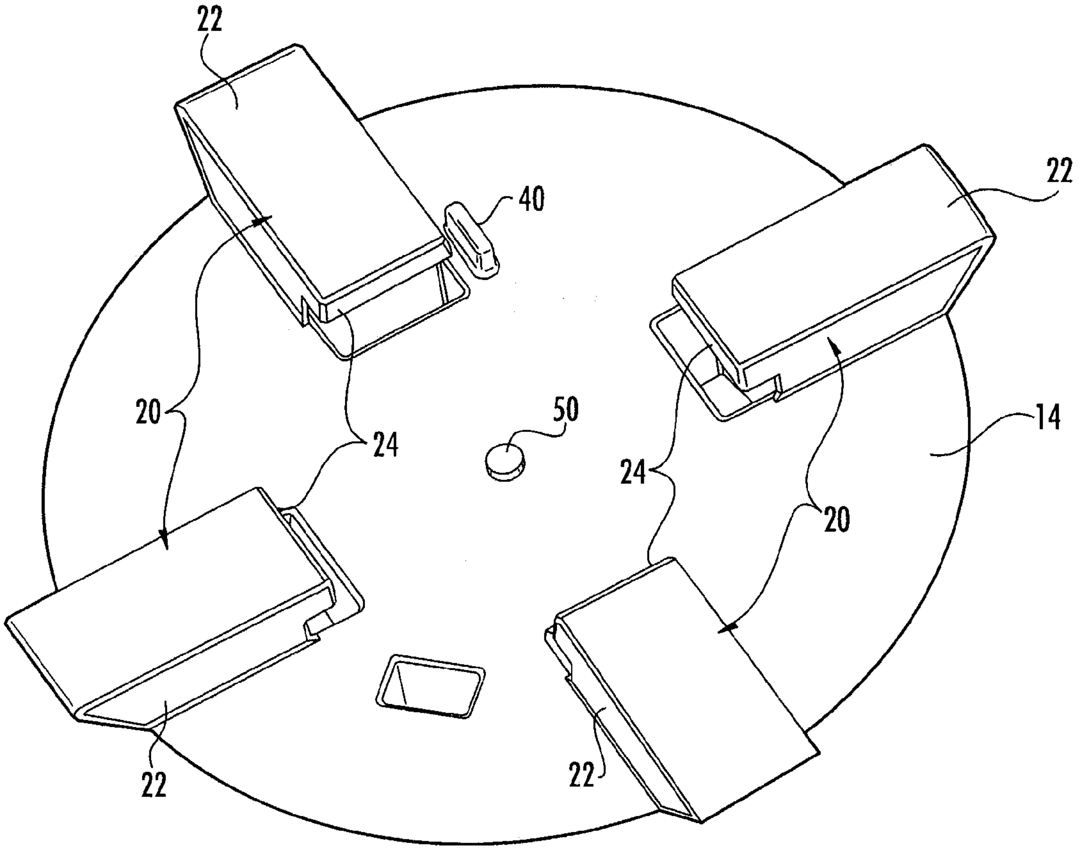
FIG. 2 is a detailed perspective view of the heatsink of FIG. 1.

Referring to FIGS. 1 and 2 an embodiment of a heatsink 10 is shown comprising a body 12 made of a thermally conductive material such as metal, ceramic or thermally conductive polymer. A typical heatsink may be made of aluminum although other thermally conductive materials such as copper may be used. The heatsink may comprise a flat plate, a diecast finned heatsink, or an extruded finned heat sink. An LED package may be supported by the heatsink 10 such that the heatsink dissipates heat from the LED package.

Figure 3:
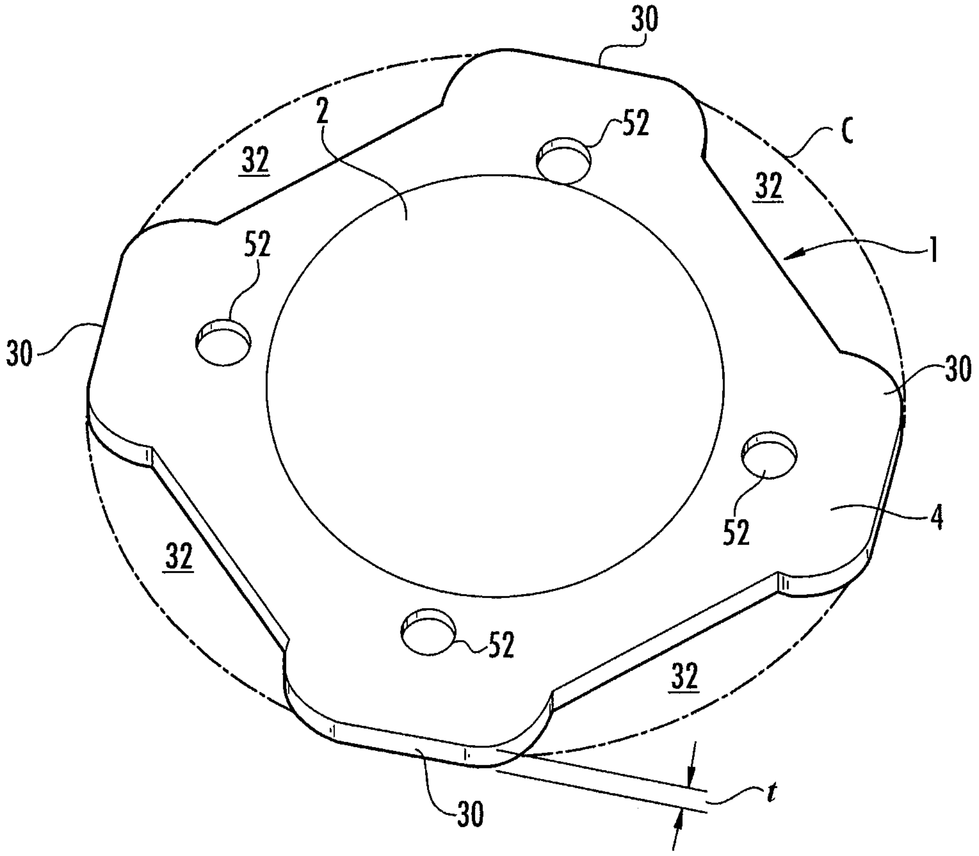
FIG. 3 is a perspective view of an embodiment of a LED package usable with the heatsink of FIG. 1.
Figure 4:
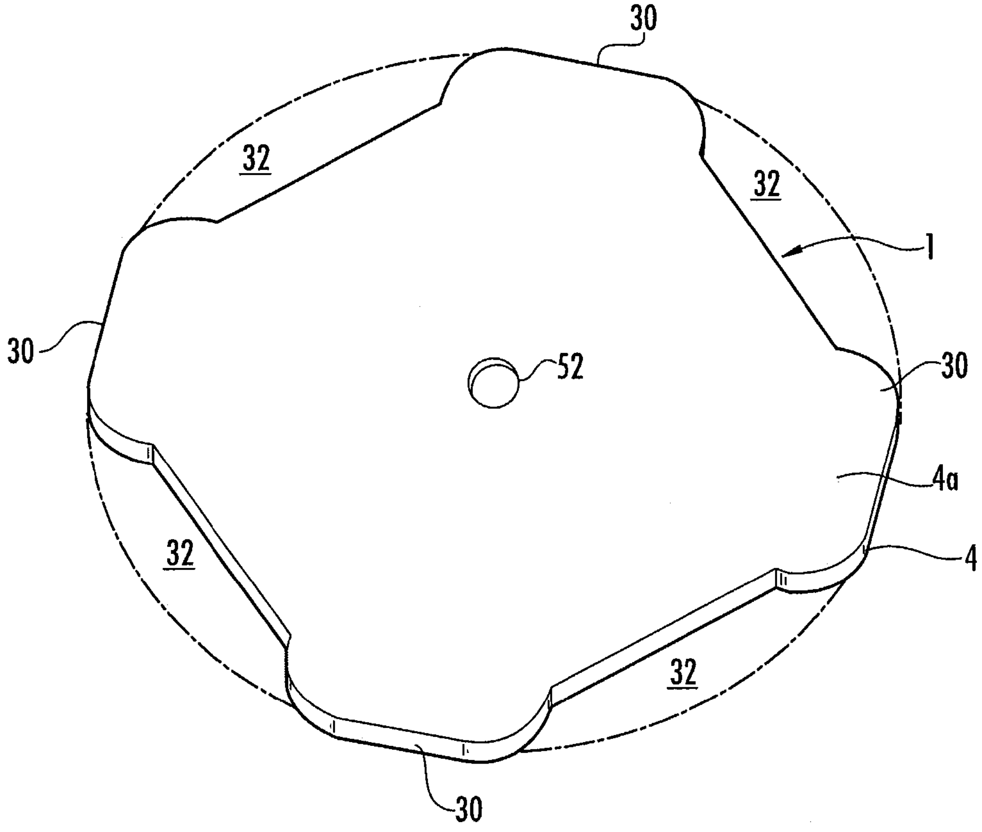
FIG. 4 is a bottom view of the LED package of FIG. 3.

Referring to FIGS. 3 and 4 an exemplary LED package is shown generally at 1 comprising an LED circuit board that supports one or more LED's (not shown) covered by a transparent domed lens 2. The LED board may be attached to a thermally conductive substrate such as an aluminum or copper layer or a (metal core printed circuit board) MCPCB. The LED package 1 comprises a first portion defined by the lens 2 through which light is emitted during operation of the LED and a base 4 that extends beyond the lens 2. The term "base" as used herein means any portions of the LED package 1 through which heat is dissipated from the LED package and that is able to be clamped as will hereinafter be described and may comprise portions of the LED circuit board, thermally conductive substrate and/or other layers. Pads or other electrical conductors may be provided on the LED package 1 for connecting the LED package to a power source. The LED package 1 may comprise a single LED chip.

In one embodiment the base 4 is provided with male connectors comprising mounting shoulders 30 that form part of the base 4 and are spaced about the periphery of base 4. The mounting shoulders 30 are portions of the base 4 that may be clamped by the retention arms 24 to retain the LED package 1 on the heatsink 10 as will be described. The mounting shoulders 30, as shown, comprise projections that extend from the central portion of the base 4 to create recesses 32 between the mounting shoulders 30. Recesses 32 accommodate the retention arms 24 when the LED package 1 is located on support surface 14 of the heatsink as will hereinafter be described. In the illustrated embodiment mounting shoulders 30 are spaced 90 degrees from one another and recesses 32 alternate with the mounting shoulders 30 and are also spaced 90 degrees from one another. The ends of the mounting shoulders 30 lie along an imaginary circle C where the recesses 32 are set back from circle C to create open areas between mounting shoulders 30.

Figure 5:
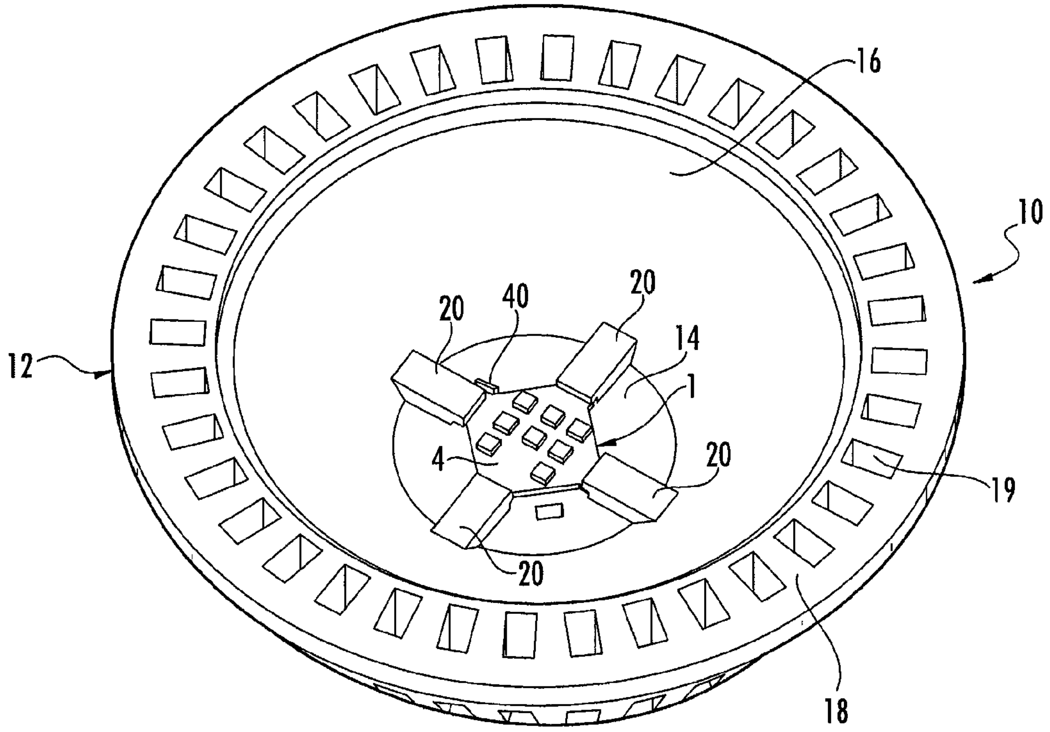
FIG. 5 is a perspective view of an embodiment of the heatsink of the invention having another embodiment of the LED package mounted thereon.

Referring to FIGS. 1, 2, 5 and 6, in the illustrated embodiment the heatsink 10 comprises a support surface 14 that receives and supports the LED package 1 such that surface 14 is in direct contact with the bottom surface 4*a* of the base 4 of the LED package 1. The LED package 1 in the embodiment of FIG. 5 is shown with a plurality of LED devices mounted on the base 4. Because the base 4 typically has a flat bottom surface 4*a* (FIG. 4), the support surface 14 comprises a flat surface such that the support surface 14 will contact the bottom surface 4*a* of the LED package 1 over substantially the entire surface 4*a* with no air gaps between the surfaces so as to maximize heat transfer between the LED package 1 and the heatsink 10. The heatsink 10 further comprises a conical sidewall 16 that diverges as is extends away from the support surface 14. The conical side 16 wall terminates in an annular flange 18 that may support a plurality of fins 19 that facilitate heat transfer to the ambient environment and allow good air flow over, and increase the surface area of, the heatsink 10. The surface area of the heatsink 10 is large enough to dissipate heat generated by the LED package 1. While an exemplary heatsink is shown and described, the mounting apparatus and method may be used with any heatsink suitable for use with an LED package.

Figure 6:
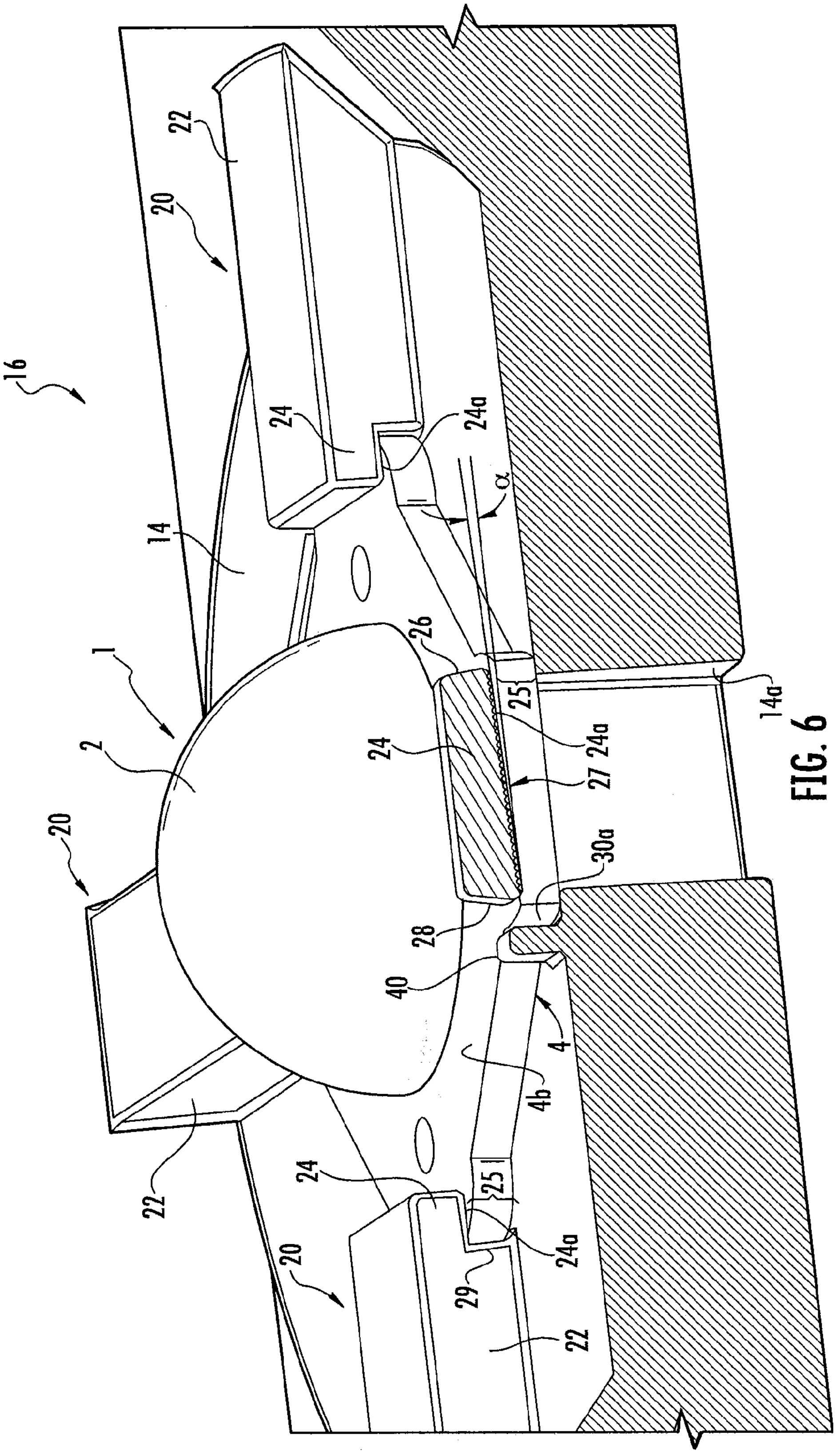
FIG. 6 is a detailed perspective view showing the LED package mounted to the heatsink.

Referring to FIGS. 2 and 6, to retain the LED package 1 on the heatsink 10, a plurality of female connectors comprising LED package mounts 20 are provided that clamp the LED package 1 against the support surface 14. Each mount 20 comprises a body portion 22 that is fixed to the heat sink 10 and a retention arm 24 that is spaced from and may extend over the surface 14 creating a space 25 between the support surface 14 and the bottom surface 24*a* of the retention arm 24. In the illustrated embodiment an access hole 14*a* is formed in surface 14 below the retention arm 24 as part of the die cast process to create the undercut that forms the extending retention arm 24. In other manufacturing processes the access hole 14*a* may be eliminated. Further, while access hole 14*a* is located below the retention arm 24 the base 4 spans the access hole 14*a* such that when the retention arm 24 exerts a force on the base 4 towards surface 14, base 4 is pressed into tight engagement with surface 14. The space 25 is dimensioned such that it is substantially the same or slightly smaller than the thickness t of the base 4 of the LED package 1 such that when the base 4 is forced into the space 25 the retention arm 24 exerts a force on the base 4 sufficient to clamp the base 4 against the surface 14 and retain the LED package 1 on the heatsink 10. The retention arms 24 are mounted in a cantilevered fashion to the body portions 22 such that they extend over surface 14. When the base 4 of the LED package 1 is forced beneath the retention arms 24, the arms 24 create a compressive clamping force on the LED package 1 that forces the bottom surface 4*a* of the base 4 into tight engagement with the support surface 14 of the heatsink 10.

Referring to FIG. 6, the bottom surfaces 24*a* of retention arms 24 are formed at an angle $\alpha$ relative to the support surface 14 such that the surfaces 24*a* act as camming members to exert a force on the base 4 of the LED package toward surface 14 to clamp the base 4 against surface 14. Each surface 24*a* comprises a first front end 26 and a second rear end 28 where the base 4 of LED package 1 is inserted into the first front end 26 and is rotated towards the second rear end 28 during installation of the LED package 1 on the heatsink 10. The surface 20 is angled such that the first front end 26 is spaced from the surface 14 a distance slightly greater than the second rear end 28 such that as the base 4 is moved to the locked position under the retention arm 24 the surface 24*a* applies an increasing force on the base 4 to press the base against surface 14 and to hold the LED package 1 in position on heat sink 10. The first end 26 may be spaced from surface 14 a distance slightly greater than the thickness t of base 6 to allow the base to be inserted under retention arm 24 and the second end 28 may be spaced from surface 14 a distance slightly less than the thickness t of base 4 such that the retention arm 24 exerts a compressive force on the base toward surface 14 to clamp the base 4 against the surface 14.

In the illustrated embodiment the base 6 comprises male connectors defined by mounting shoulders 30 that is received by the female connector defined by the retention arms 24 and surface 13. These elements may be reversed such that the base 6 defines a female connector that is engaged by a male connector on the heatsink 10. Further, while specific embodiments of the male and female connectors are shown, these elements may comprise a variety of shapes and configurations provided that the engagement of these elements fixes the LED package 1 to the heatsink 10 such that good thermal conductivity between these elements. The connectors function to thermally and physically connect the LED package to the heatsink. The connectors may also be used to electrically connect the LED package to the heatsink.

The surface 24*a* may also be provided with a plurality of small projections 27 such as a roughened or dimpled surface. The projections 27 mechanically engage the upper surface 4*b* of the base 4 to create a mechanical lock between the retention arms 24 and the base to prevent the LED package 1 from moving from the locked position after assembly of the device.

A stop tab 40 is also provided on body 12 to limit the lateral movement of the LED package 1 relative to the body 12 to ensure that the base 4 is properly seated relative to the retention arms 24. The stop tab 40 projects into the path of travel of the base 4 when the LED package 1 is moved relative to the heatsink body 12 during mounting of the LED package 1 on the heatsink 10. The stop tab 40 is engaged by a portion of the LED package 1 as the LED package is moved to the locked position to fix the LED package in a known position relative to the retention arms 24. The stop tab 40 may extend from surface 14 as shown. The stop tab 40 may also extend from the body portions 22 or arms 24. The stop tab 40 engages a lateral edge 30*a* of one of mounting shoulders 30 when the LED package is properly positioned on the support surface 14. While the illustrated embodiment shows the stop tab 40 located adjacent one of the retention arms 24 and engaged by the lateral edge of one of the mounting shoulders 30, the stop tab 40 may be located elsewhere on the body 12 and may be engaged by structure on the LED package 1 other than the mounting shoulders 30. Further, more than one stop tab may be used.

In the illustrated embodiment four LED package mounts 20 are provided spaced at 90 degree intervals about support surface 14 such that a uniform force is applied across the base 4 of LED package 1. The mounts 20 may be disposed in opposed pairs as shown. A greater number of mounts 20 may be used. Moreover, a fewer number of mounts 20 may be used provided that the bottom surface 4*a* of the base 4 of LED package 1 is held in tight contact with the support surface 14 of the heatsink 10 with no deformation or waffling of the base 4 and no air gaps between the base 4 and surface 14. The retention arms 24 and body portions 22 may be formed integrally with the heatsink body 12 and the retention arms 24, body portions 22 and the heatsink body 12 may be made of one-piece such as by an extrusion or casting process.

The retention arms 24 and body portions 22 are in thermally conductive contact with the heatsink body 12 such that heat may be thermally conducted through the mounts 20 from the LED package 1 to the heatsink body 12. Because the retention arms 24 extend over the top surface 4*b* of base 4 and are in tight contact with the top surface 4*b*, heat is also dissipated directly from the top surface 4*b* of the base 4 through the retention arms 24 and body portions 22 as well as from the bottom surface 4*a* of the base 4 through support surface 14. Dissipating heat from the top surface 4*b* of the base 4 enhances heat transfer from the LED package 1 because the top surface 4*b* of the base 4 is often the hotter side of the LED package. The surface area of the retention arms 24 and bodies 22 may be maximized to enhance heat transfer from the top surface 4*b* of the base 4 to the heatsink body 12.

Figure 7:
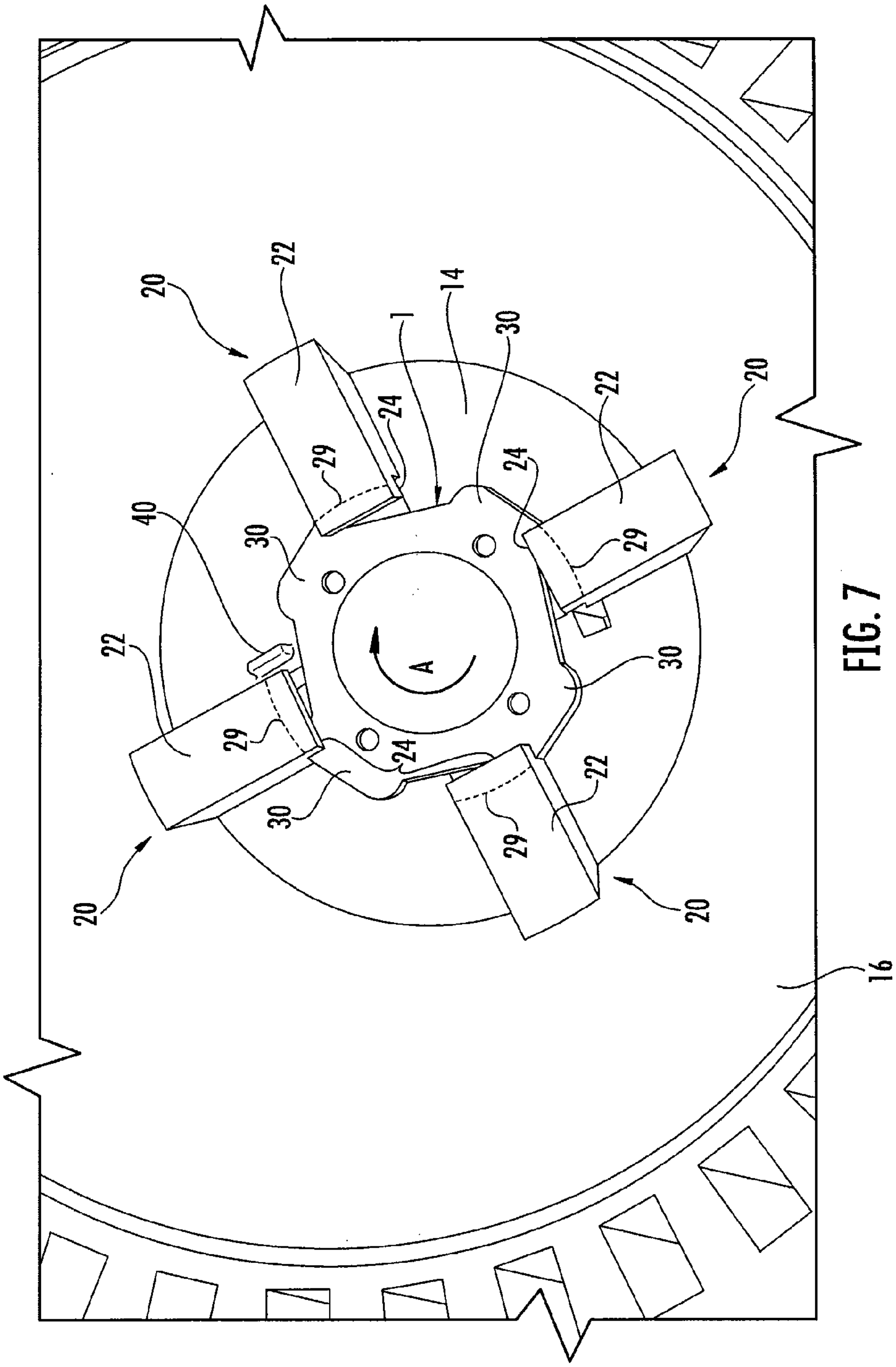
FIG. 7 is a detailed perspective view showing the LED package in the unlocked position on the heatsink.
Figure 8:
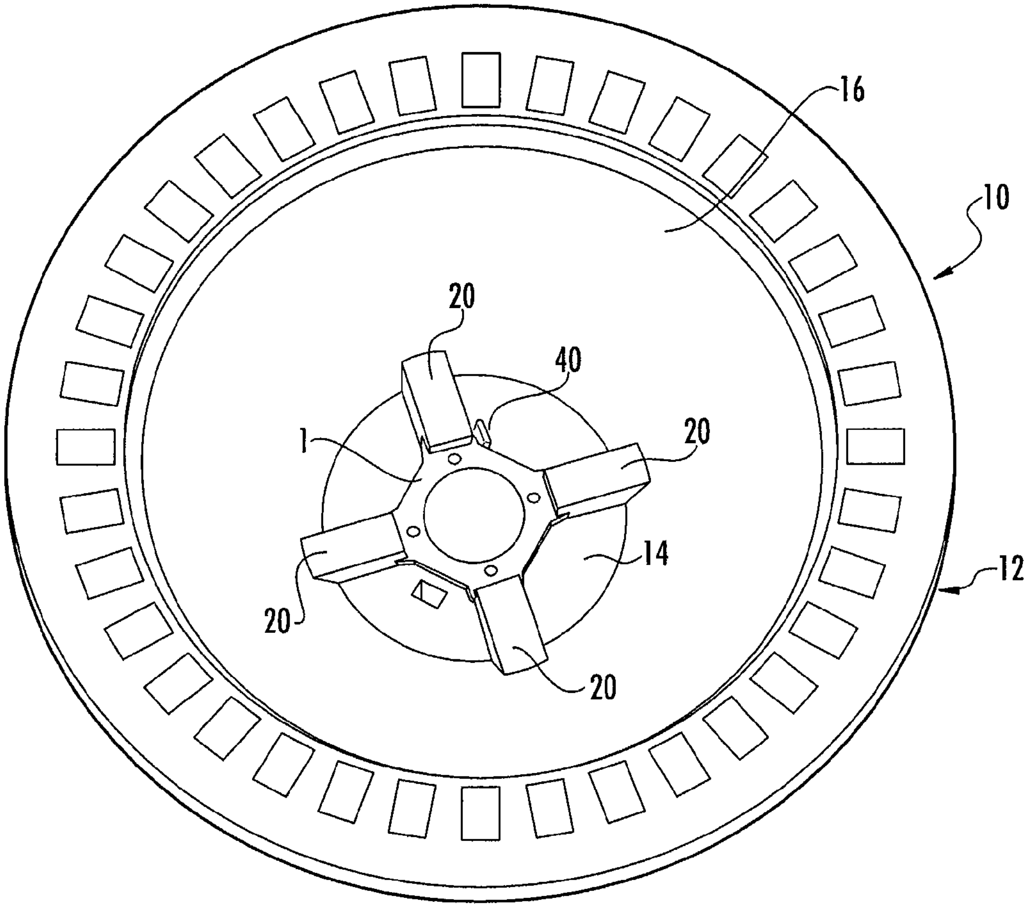
FIG. 8 is a detailed perspective section showing the LED package in the locked position on the heatsink.

Referring to FIG. 7, to mount the LED package 1 to the heatsink 10, the LED package 1 may be placed on the support surface 14 in the unlocked position where the retention arms 24 are positioned in recesses 32 of LED package 1 and the mounting shoulders 30 are located between the mounts 20 and adjacent the arms 24. The recesses 32 accommodate the arms 24 such that the LED package 1 may be placed on surface 14 without the arms 24 interfering with the placement of the LED package. The recesses 32 and mounting shoulders 30 on the base 4 are arranged to accommodate the retention arms 24 such that the number and relative positions of the recesses 32 and mounting shoulders 30 conform to the number and relative positions of the mounts 20. The mounting shoulders 30 may be dimensioned such that the mounting shoulders 30 have a surface area that maximizes heat transfer to the mounts 20. Once the LED package 1 is positioned on the surface 14 as shown in FIG. 7, the LED package 1 is pressed against surface 14 and is rotated relative to the body 12 in the direction of arrow A to the locked position shown in FIGS. 6 and 8. In the locked position the mounting shoulders 30 are forced under the retention arms 24 and the retention arms engage the mating mounting shoulders 30 to exert a force on the base 4 pressing the base against the surface 14.

To properly position the LED package 1 on the surface 14, the surface 14 may be provided with a centrally located engagement element 50 (FIG. 2) that engages a centrally located mating engagement element 52 (FIG. 4) formed on the bottom surface 4*a* of base 4. Engagement element 50 may comprise a protrusion or pin that engages a centrally located aperture 52 (FIG. 4) formed on the bottom surface 4*a* of base 4. The engagement of the pin 50 with the aperture 52 properly locates the LED package 1 on surface 14 relative to the retention arms 24. Pin 50 acts as a pivot axis when the LED package 1 is rotated to the locked position. The vertical walls 29 of retention mounts 20 that form the ends of spaces 25 are curved as shown in FIG. 7 to allow the mounting shoulders 30 to rotate below arms 24 as the LED package 1 is rotated into the locked position.

The screwless mounting apparatus eliminates the use of separate fasteners such as screws which lowers the cost and time of manufacture and is particularly beneficial in high volume production. The retention arms 24 also provide a constant clamping force over time. Because the clamping force between the LED package and heatsink is maintained over time, good heat transfer between the LED package and the heatsink is also maintained. The retention arms 24 and stop tab 40 also positively retain the LED package 1 from movement in all directions relative to the heat sink 10. The retention arms 24 are also easily scalable to larger LED packages and multiple LED packages mounted on a MCPCB. The retention arms 24 also eliminate waffling of the LED package, uneven torque application of the screws on the LED package and screw loosening that may occur when screws are used to attach the LED package to the heatsink.

Figure 10:
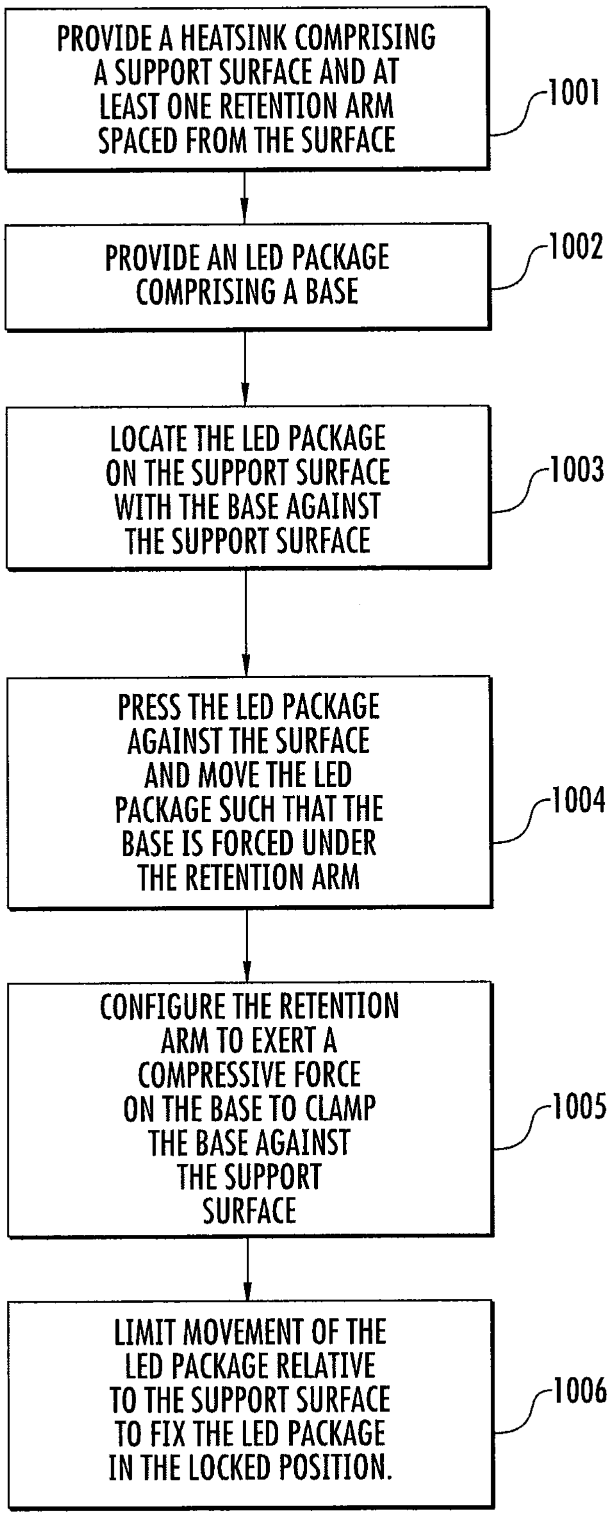
FIG. 10 is a block diagram illustrating a method of mounting a LED package on a heatsink.

Referring to FIG. 10, to assemble a LED package in the heatsink, a heat sink comprising a support surface and at least one retention arm spaced from the support surface is provided (block 1001). A LED package comprising a base is also provided (block 1002). The base may comprise mounting shoulders. The LED package is located on the support surface such that the base is positioned against the surface (block 1003). The mounting shoulders may be located adjacent to the retention arms. The LED package is pressed against the support surface and is moved such that the base/mounting shoulders are forced under the retention arms (block 1004). The LED package may be preferably rotated to locate the mounting shoulders under the retention arms. An automated force plunger with a single action clock-wise torque may be used to assemble the LED package in the heatsink. To accommodate the plunger and provide a uniform clamping force over the LED package 1, a plurality of spaced recesses 52 may be provided on the top surface 4*b* of base 4. The plunger engages the recesses 52 to force the base 6 against support surface 14 and to apply the rotational force to the LED package 1 during installation. The retention arms are configured and dimensioned to exert a compressive force on the base to clamp the base of the LED package against the support surface (block 1005). Rotation of the LED package 1 relative to the support surface is limited by a stop that engages the LED package to fix the LED package in the locked position relative to the retention arms (block 1006).

Figure 9:
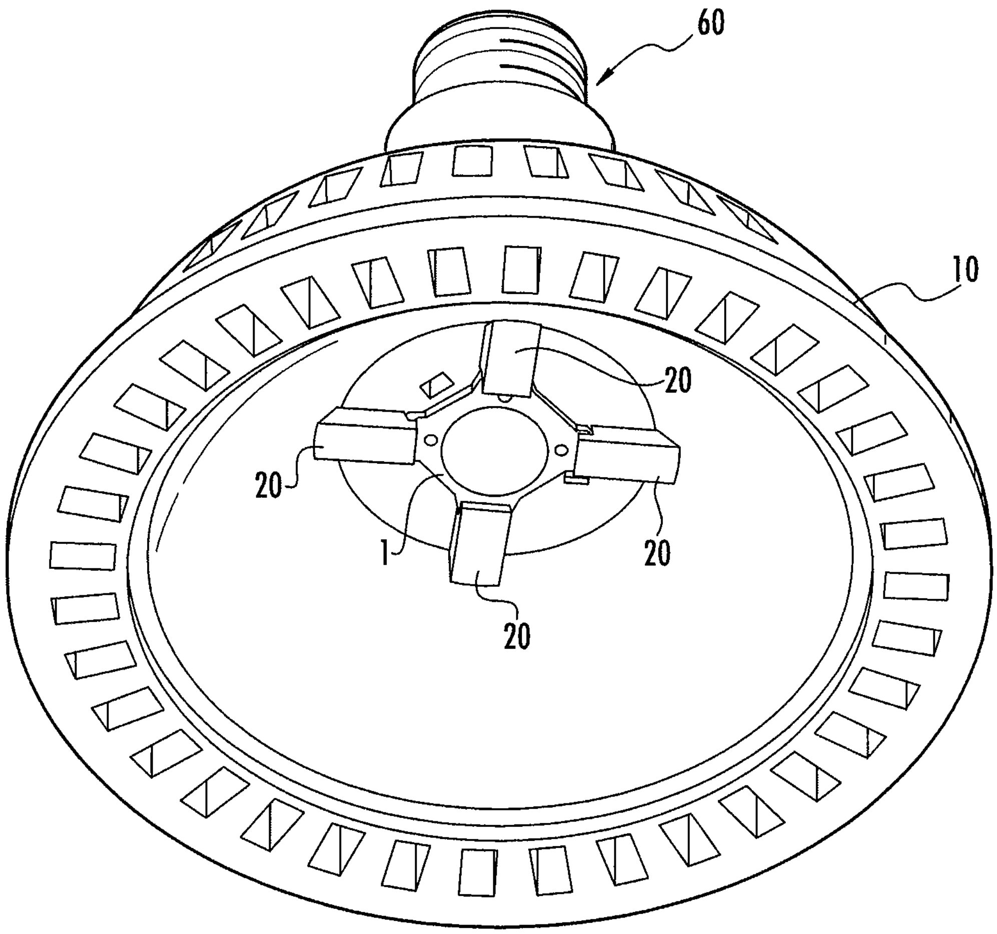
FIG. 9 is a perspective view showing the heat sink and LED package in an embodiment of a light fixture.

Referring to FIG. 9, the assembled heat sink and LED package may be in electrical communication with an electrical conductor such as electrical connector 60 for providing power to the LED package to create a complete lighting unit. In the illustrated embodiment the connector 60 is a screw type connector. The connector 60 may be screwed into a socket or otherwise connected to a source of power. Other types of connectors may also be used. The heatsink 10, LED package 1 and connector 60 may be further packaged in a housing and/or provided with a cover to make a commercial lighting unit. The lighting unit may have a variety of uses in a variety of applications where the housing, connector, cover, heatsink and LED package may be specifically designed for use in such applications.

While embodiments of the invention are disclosed herein, various changes and modifications can be made without departing from the spirit and scope of the invention as set forth in the claims. One of ordinary skill in the art will recognize that the invention has other applications in other environments. Many embodiments are possible. The following claims are in no way intended to limit the scope of the invention to the specific embodiments described above.

The invention claimed is:

1. A light emitting diode (LED) package mounting apparatus comprising:

a heatsink comprising a first surface and an arm, the arm disposed over the first surface and defining a space between the arm and the first surface wherein the arm comprises a camming surface extending at an angle relative to the first surface between a first end of the arm and a second end of the arm such that the distance between the camming surface and the first surface decreases from the first edge toward the second edge;

an LED package comprising a base that supports an LED, the base comprising a second surface that supports the LED and a third surface in contact with the first surface over substantially the entire extent of the third surface, the base being inserted into the space from the first end such that a force applied to the base by the camming surface increases as the base is inserted into the space, the arm engaging the second surface of the base such that the force is exerted on the base to clamp the third surface against the first surface.

2. The apparatus of claim 1 wherein the arm further comprises a plurality of arms wherein the plurality of arms are equally spaced about the first surface.

3. The apparatus of claim 2 wherein the plurality of arms are arranged in opposed pairs.

4. The apparatus of claim 2 wherein the base comprises a plurality of projections extending laterally from the base, said plurality of projections being spaced from one another by a plurality of recesses, the plurality of recesses being wider than the plurality of arms.

5. The apparatus of claim 1 wherein the arm comprises a projection for mechanically engaging the base.

6. The apparatus of claim 1 wherein the arm extends in a cantilevered fashion.

7. The apparatus of claim 1 wherein the camming surface presses the base against the first surface when the base is rotated relative to the camming surface.

8. The apparatus of claim 1 wherein the base comprises a shoulder defined by a pair of recessed areas that extends under the arm.

9. The apparatus of claim 1 wherein the heat sink further comprises four arms equally spaced from one another, each of the four arms disposed over the surface and defining spaces between the arms and the first surface, wherein the base comprises a plurality of male connectors, one of the plurality of male connectors being disposed in each one of the spaces, the four arms being configured such that the four arms exert the force on the base that clamps the LED package against the first surface.

10. The apparatus of claim 9 wherein the base comprises four shoulders defined by recessed areas between the shoulders, one of the four shoulders being located under each one of the four arms.

11. The apparatus of claim 1 further comprising a tab on the heatsink for engaging the LED package to fix a lateral position of the LED package relative to the first surface.

12. A light emitting diode (LED) package mounting apparatus comprising: a heatsink comprising a surface and a first arm and a second arm spaced from the surface to define a first space between the first arm and the surface and a second space between the second arm and the surface; an LED package having a base that supports an LED, the base comprising a first shoulder and a second shoulder, said first shoulder being disposed in the first space and the second shoulder being disposed in the second space, the first arm being configured such that the first arm exerts a force on the first shoulder to clamp the first shoulder between the first arm and the surface and the second arm being configured such that the second arm exerts the force on the second shoulder to clamp the second shoulder between the second arm and the surface such that the base is pressed against the surface without waffling the base wherein a first recess is disposed between the first shoulder and the second shoulder and a second recess is disposed between the second shoulder and the first shoulder.

13. A method of assembling a light emitting diode (LED) package in a heatsink comprising:

providing a heatsink comprising a first surface and a second surface disposed over the first surface and defining a space between the first surface and the second surface;

providing an LED package comprising a LED board on which a LED is mounted, the LED board comprising a shoulder formed between two recesses;

locating the LED package on the first surface;

after locating the LED package on the first surface, rotating the LED package and heatsink relative to one another such that the shoulder is inserted into the space to engage the LED package with the first surface to thereby thermally couple the heat sink to the LED package.

14. The method of claim 13 wherein the second surface is formed on an arm that is spaced from the first surface to define the space, each of the two recesses being wider than the arm.

15. The method of claim 14 wherein the step of rotating the LED package further comprises rotating the LED package such that the shoulder is disposed under the arm.

16. The method of claim 13 wherein the step of rotating the LED package relative to the surface further comprises engaging a stop on the heatsink to limit movement of the LED package.

17. A light emitting diode (LED) package mounting apparatus comprising:

a heatsink comprising a first surface and a second surface disposed over the first surface and defining a space between the first surface and the second surface and a first engagement element on the first surface;

an LED package comprising a second engagement element and a LED board on which a LED is mounted, the LED board comprising a shoulder formed between two recesses the shoulder being disposed in the space such that a force is exerted on the LED board that clamps the LED board against the first surface, the first engagement element engaging the second engagement element such that the first engagement element is rotatable relative to the second engagement element such that the LED board is able to rotate relative to the heat sink on the surface to insert the shoulder into the space.

18. A light emitting diode (LED) package mounting apparatus comprising:

a heatsink comprising a plurality of stationary arms, the stationary arms formed as part of the heat sink and disposed over the surface and defining a plurality of spaces where one space of the plurality of spaces is positioned between one arm of the a plurality of stationary arms and the surface;

an LED package comprising a base that supports an LED, the base comprising a plurality of shoulders and a plurality of recesses, one of the recesses disposed between two adjacent shoulders, one shoulder of said plurality of shoulders being disposed in each of the plurality of spaces, the plurality of arms being configured to exert a force on the plurality of shoulders to clamp the shoulders between the arms and the surface;

the base having a thickness, and a distance between the plurality of arms and the surface being less than the thickness of the base such that the plurality of arms contacts a first surface of the base and the surface contacts a second surface of the base such that a force is exerted on the base that clamps the LED package against the surface without waffling the base.

19. A light emitting diode (LED) package mounting apparatus comprising:

a heatsink comprising a first surface and a female connector, the female connector comprising a plurality of arms equally spaced about the first surface, the plurality of arms disposed over the first surface and defining spaces between the plurality of arms and the first surface;

an LED package comprising a base that supports an LED, the base comprising a second surface in contact with the first surface over substantially the entire extent of the second surface and a male connector, the male connector comprising a plurality of projections extending laterally from the base, said plurality of projections being spaced from one another by a plurality of recesses, the plurality of recesses being wider than the plurality of arms and disposed in the spaces, the plurality of arms being configured such that the plurality of arms exert a force on the base that clamps the second surface of the LED package against the first surface.

20. A light emitting diode (LED) package mounting apparatus comprising:

a heatsink comprising a first surface and an arm, the arm disposed over the first surface and defining a space between the arm and the first surface;

an LED package comprising a base that supports an LED, the base comprising a second surface that supports the LED and a third surface in contact with the first surface over substantially the entire extent of the third surface, the arm engaging the second surface of the base such that a force is exerted on the base that clamps the third surface against the first surface;

a first engagement element on the first surface that engages a second mating engagement element on the base such that the first engagement element is rotatable relative to the second engagement element and the base.

21. The apparatus of claim 20 wherein the base has a thickness, and a distance between the arm and the first surface is less than the thickness of the base.

* * * * *